(12) United States Patent
Yamada

(10) Patent No.: US 7,465,910 B2
(45) Date of Patent: Dec. 16, 2008

(54) SOLID STATE IMAGING DEVICE WITH INCREASED VERTICAL AND HORIZONTAL RESOLUTIONS IN INTERLACE SCANNING METHOD

(75) Inventor: Tetsuo Yamada, Miyagi (JP)

(73) Assignee: Fujifilm Corporation, Minato-ku, Tokyo (JP)

( * ) Notice: Subject to any disclaimer, the term of this patent is extended or adjusted under 35 U.S.C. 154(b) by 91 days.

(21) Appl. No.: 11/191,002

(22) Filed: Jul. 28, 2005

(65) Prior Publication Data

US 2006/0022117 A1 Feb. 2, 2006

(30) Foreign Application Priority Data

Jul. 29, 2004 (JP) ............................. 2004-221783

(51) Int. Cl.
*H01L 27/00* (2006.01)
(52) U.S. Cl. .................... 250/208.1; 348/275; 348/280
(58) Field of Classification Search .............. 348/275, 348/280; 250/208.1
See application file for complete search history.

(56) References Cited

U.S. PATENT DOCUMENTS

| | | | | |
|---|---|---|---|---|
| 4,081,841 A | * | 3/1978 | Ochi et al. ................ | 348/315 |
| 4,553,159 A | * | 11/1985 | Moraillon .................. | 348/280 |
| 4,876,590 A | * | 10/1989 | Parulski ..................... | 348/281 |
| 5,150,204 A | * | 9/1992 | Yamazaki ................... | 348/234 |
| 5,374,956 A | * | 12/1994 | D'Luna ...................... | 348/275 |
| 5,821,998 A | * | 10/1998 | Murakami et al. .......... | 348/241 |
| 5,956,086 A | * | 9/1999 | Sawanobori ................ | 348/273 |
| 6,169,577 B1 | * | 1/2001 | Iizuka ......................... | 348/317 |
| 6,388,278 B1 | * | 5/2002 | Suzuki et al. ............... | 257/222 |
| 6,522,356 B1 | * | 2/2003 | Watanabe .................... | 348/272 |
| 6,992,714 B1 | * | 1/2006 | Hashimoto et al. .......... | 348/273 |
| 6,999,119 B1 | * | 2/2006 | Shibazaki et al. ........... | 348/273 |
| 2001/0010554 A1 | * | 8/2001 | Yoshida ..................... | 348/312 |
| 2002/0057354 A1 | * | 5/2002 | Yanai et al. ................. | 348/273 |

FOREIGN PATENT DOCUMENTS

JP 10-136391 5/1998

OTHER PUBLICATIONS

Tetsuo Yamada, et al., "2000 IEEE International Solid-State Circuits Conference," ISSCC Digest of Technical Papers, pp. 110-111.

* cited by examiner

*Primary Examiner*—Seung C Sohn
(74) *Attorney, Agent, or Firm*—McGinn IP Law Group, PLLC

(57) ABSTRACT

A solid state imaging device comprises a semiconductor substrate defining a two-dimensional surface, a plurality of photoelectric conversion elements disposed in a light receiving area of said semiconductor substrate in a plurality of rows and columns, color filters in a plurality of colors, each color filter being arranged in correspondence with each photoelectric conversion element, wherein at least a color defining resolution corresponds to two photoelectric conversion elements adjacent to each other in a horizontal direction or in a vertical direction, a vertical electric charge transferring device that vertically transfers signal electric charges generated by the photoelectric conversion elements, a horizontal electric charge transfer device that horizontally transfers the signal electric charges transferred by the vertical electric charge transferring device, and an output device that outputs the signal electric charges transferred by the horizontal electric charge transferring device.

18 Claims, 12 Drawing Sheets

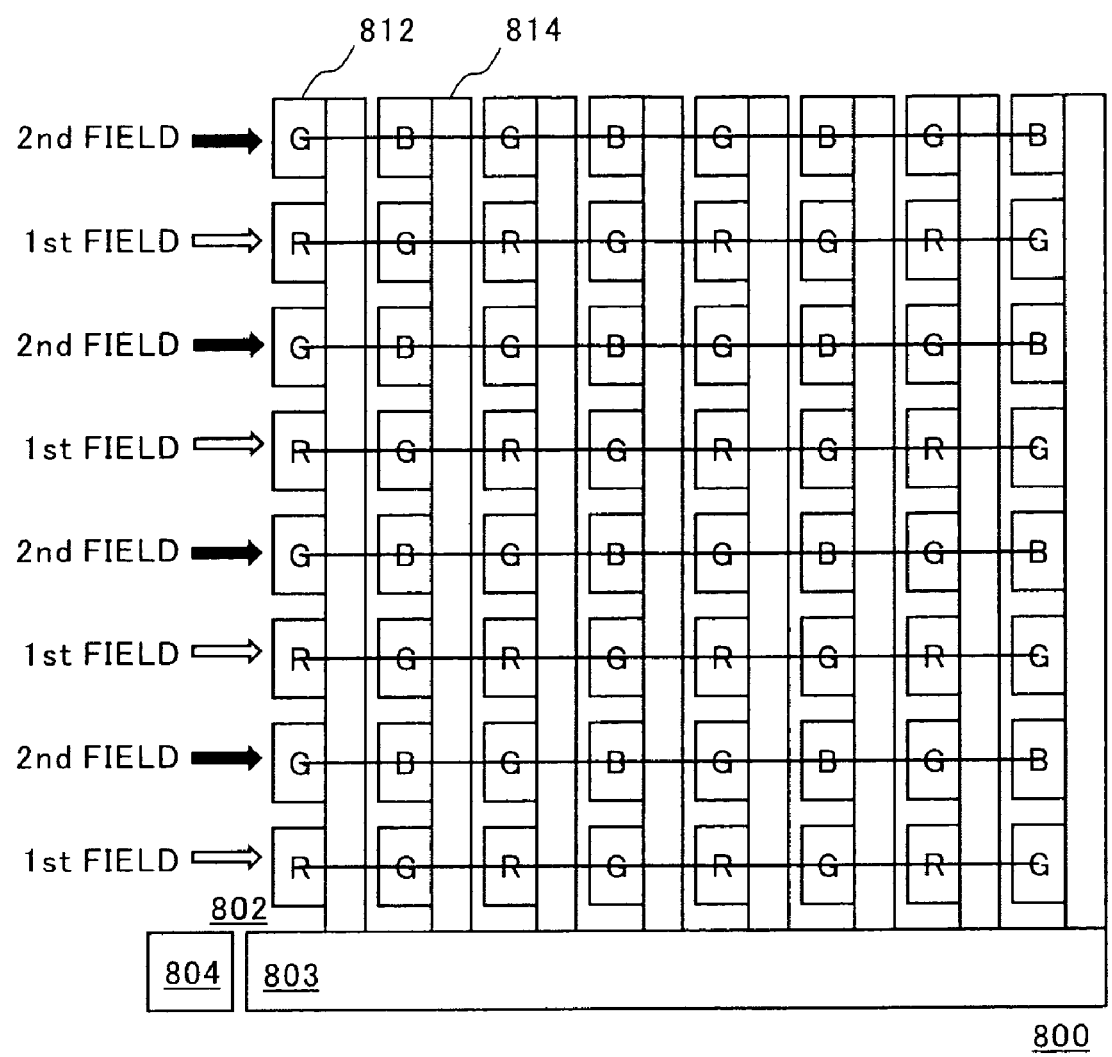

CENTERS OF G ⇒
CENTERS OF G ➡

FIG. 12A
PRIOR ART

```
1st G-LINE  G  R  G  B  G  R  G  B
            +  +  +  +  +  +  +  +
2nd G-LINE  G  R  G  B  G  R  G  B

5th G-LINE  G  R  G  B  G  R  G  B
            +  +  +  +  +  + .+  +
6th G-LINE  G  R  G  B  G  R  G  B
```

FIG. 12B
PRIOR ART

```
3rd G-LINE  G  B  G  R  G  B  G  R
            +  +  +  +  +  +  +  +
4th G-LINE  G  B  G  R  G  B  G  R

7th G-LINE  G  B  G  R  G  B  G  R
            +  +  +  +  +  +  +  +
8th G-LINE  G  B  G  R  G  B  G  R
```

FIG. 12C
PRIOR ART

```
1st+2nd G-LINES  2G  2R  2G  2B  2G  2R  2G  2B
3rd+4th G-LINES  2G  2B  2G  2R  2G  2B  2G  2R
5th+6th G-LINES  2G  2R  2G  2B  2G  2R  2G  2B
7th+8th G-LINES  2G  2B  2G  2R  2G  2B  2G  2R
```

SOLID STATE IMAGING DEVICE WITH INCREASED VERTICAL AND HORIZONTAL RESOLUTIONS IN INTERLACE SCANNING METHOD

CROSS REFERENCE TO RELATED APPLICATION

This application is based on Japanese Patent Application 2004-038266, filed on Jul. 29, 2004, the entire contents of which are incorporated herein by reference.

BACKGROUND OF THE INVENTION

A) Field of the Invention

This invention relates to a solid state imaging device, especially to a structure of a solid state imaging device for a digital still camera.

B) Description of the Related Art

Recently the number of pixels in a digital still camera (hereinafter called DSC) follows a course of increase, and there is a DSC having over ten million pixels. It is obvious that an increase in the number of pixels leads to improvement of resolution; however, it also leads to various problems. For example, a quantity of output data will increase, a reading time for one frame (screen) becomes longer and a frame rate will be lowered. in order to prevent the lowering of the frame rate, it is necessary for the DSC to be driven faster (to have a high frame rate). Moreover, for example, increase in the number of pixels means that increase in a quantity of data to be stored; therefore, it causes increase in a size of a storage medium. Furthermore, a pixel size becomes smaller to increase the number of pixels without enlarging a size of a chip in the solid-state imaging device, and It lowers sensitivity of the solid-state imaging device, which is the most important feature of the solid state imaging device. Further, it will be difficult to generate a high quality motion picture (e.g., VGA quality) at a proper frame rate (e.g., 30 fps).

Generally an image taken by the DSC will be printed onto L-size (89×127 mm) photo paper, 4×6" photo paper or a post card. The number of pixels sufficient for realizing necessary resolution to print the image onto such papers is two to three millions. Therefore, it is wasteful to take a picture for the papers in those sizes by using a solid-state imaging device having ten million pixels in its maximum performance, and it further causes decrease in resolution and in quality of a motion picture.

FIG. 9 is a schematic plan view of a conventional solid state imaging device 800.

The solid state imaging device 800 is the most commonly used interlace-type CCD (ITCCD) as a conventional solid state imaging device, A large number of photoelectric conversion elements (pixels) 812 are arranged in a tetragonal matrix in a light receiving region 802. A vertical electric charge transfer device (vertical charge coupled device: VCCD) 814 that reads out signal charges generated at the photoelectric conversion elements 812 and vertically transfers is formed including transfer electrodes and a vertical transfer channel for each column of the photoelectric conversion elements 812 and transfers the signal charges generated at photoelectric conversion elements 812 in a vertical direction.

In the drawing, a horizontal electric charge transfer device (horizontal charge coupled device: HCCD) 803 that transfers electric charges transferred by the VCCD 814 to a peripheral circuit 804 line by line is formed under the light receiving region 802. Also, pixel lines on lines indicated with white arrows are first field lines in an interlace scanning method, and pixel lines on lines indicated with black arrows are second field lines.

A color filter arrangement corresponding to each pixel is presented with letters "R, G and B" in each pixel. Here in this specification, R, G and B respectively indicate red, green and blue. The color filter arrangement adopted in this solid state imaging device 800 is so-called Bayer arrangement and generally used for the solid state imaging device as an imaging device for a digital still camera (DSC).

In, the DSC, image information is extracted in the form of an electric signal; therefore, it is comparatively easy to generate a motion picture by reading out field images continuously. It is common to display the motion picture on a liquid crystal display monitor, which corresponds to a finder of a conventional camera, by using the above-described feature.

At least 15 fps is necessary to smoothly express a motion of a target. Further to enjoy displaying the motion picture on a TV screen, 30 fps is necessary. However, as described in the above, it will be hard to read signals at a high frame rate when the number of pixels is increased for high resolution. Although a line curtailed operation in which a signal line is not read out at a predetermined interval to solve the problem, it may not be an efficient way because the line curtailed operation wastes the expressly taken signal electric charges. Therefore, it is efficient if the effective number of pixels can be reduced by adding the signals without curtailing the signal lines. That is, an adding operation reduces the number of signal pixels to increase quantity of signal for one pixel so that higher resolution can be realized.

FIG. 10A to FIG. 10D are diagrams showing signal arrangements read by the conventional ITCCD solid state imaging device 800.

FIG. 10A is a diagram shoving a signal arrangement of the first field, and FIG. l0B is a diagram showing a signal arrangement of the second field. Both of the first field and the second field add same colored signals in every two lines. As a result, as shown in FIG. 10C, a signal arrangement of a vertical two-pixel addition field synthesized frame generated by synthesizing each field after the vertical addition can be obtained. Moreover, the conventional reading method for the ITCCD cannot reproduce a colored motion picture. Because each field includes only two types of signals such as G and R color signals or G and B color signals, one field cannot generate color signals including all of R, G, and B color signals. Since the color signal including R, G and B can be naturally generated after the field synthesis, the color signal after the synthesis, for example, can be used for a still picture with decreased number of pixels. In this case, sensitivity will be about twice by the addition of the signals.

FIG. 10D is a diagram showing spatial sampling centers after the vertical additions. The sampling points of G formed by the vertical addition of the first field with the Bayer Arrangement will be on lines indicated by white arrows, and the sampling points of G formed by the vertical addition of the second field with the Bayer Arrangement will be on lines indicated by black arrows. As obvious from the drawing, the sampling centers of the G signals after the vertical additions do not have regular intervals. Also, since the spatial sampling centers overlap with each another in wide areas, resolution obtained for the number of the sampling points will be lowered.

FIG. 11 is a schematic plan view of a conventional solid state imaging device 200.

The solid state imaging device 200 is composed including a light receiving region 202 including a large number of photoelectric conversion elements 212 and vertical electric charge transfer devices (VCCD) 214 that vertically transfer signal charges generated at the photoelectric conversion elements 212, a horizontal electric charge transfer device (HCCD) 203 that horizontally transfers the signal charges transferred by the VCCDs 214 and an output amplifier 204.

The light-receiving region 202 in the imaging device adopting the pixel interleaved array CCD (PIACCD) as shown in the drawing consists of the plurality of photoelectric conversion elements configured in a pixel interleaved arrangement. Between each row of the photoelectric conversion elements, a vertical electric charge transfer device 214 which reads the signal electric charges generated by the photoelectric conversion elements 212 and transfers them to a vertical direction are arranged by traversing in the spaces among the photoelectric conversion elements 212 in the vertical direction. Transfer channels are positioned in the zigzag spaces formed by the pixel interleaved arrangement, and the adjacent transfer channels apart from each ether via the photoelectric conversion elements and come closer to each other via the channel stop region (not shown in the drawing). For example, the details of the pixel interleaved arrangement can be found in Japanese Laid-Open Patent Hei 10-136391 and Tetsuo Yamada, et al, February, 2000, "A Progressive Scan CCD Imager for DSC Applications", ISSCC Digest of Technical Papers, Page 110 to 111.

The vertical electric charge transfer device 214 is consisted of the vertical transfer channel (not shown in the drawing) and transfer electrodes which are formed over the vertical transfer channel via an insulating film (not shown in the drawing) and traversing between the photoelectric conversion elements 212 to the horizontal direction.

In the drawing, the color of the color filter (for example, green, blue or red) corresponding to each pixel is indicated by the letter G, B and R in each of the pixels 212. Also, pixel lines on lines indicated with white arrows are first field lines in the interlace scanning method, and pixel lines on lines indicated with blacks arrow are second field lines.

In the PIACCD shown in the drawing, the improved addition disclosed in Japanese Patent Application No. 2004-38266, filed by the same inventor as the present invention can be carried out. When the signals for the first field lines are read, the first G-line and the second G-line, and the fifth G-line and the sixth G-line are read. When the signals for the second field lines are read, the third G-line and the fourth G-line, the seventh G-line and the eighth G-line are read. As shown in the drawing, each G-line is formed along a solid line repeatedly connecting a center of each pixel in a zigzag form.

FIG. 12A to FIG. 12D are diagrams showing signal arrangements read by the conventional PIACCD solid state imaging device 200.

FIG. 12A is a diagram showing a signal arrangement of the first field, and FIG. 12B is a diagram showing a signal arrangement of the second field. G-lines adjoining each other to vertical direction exist in each field. These adjoining G-lines are added vertically. That is, the first G-lines and the second G-lines, the fifth G-lines and the sixth G-lines are respectively added in the first field, and the third G-lines and the fourth G-lines, and the seventh G-lines and the eighth G-lines are respectively added in the second field. As a result, as shown in FIG. 12C, a signal arrangement of a vertical two-pixel addition field synthesized frame generated by synthesizing each field after the vertical additions can be obtained.

FIG. 12D is a diagram showing spatial sampling centers after the vertical additions. In this embodiment, because the G-lines (the signals of the G-pixels) that are originally vertically adjoining are added, centers of the sampling points of G in a vertical direction after the field synthesis will be on a line indicated by white arrows after the vertical addition for the first field and on lines indicated by black arrows after the vertical addition for the second field. Therefore, as shown in FIG. 12D, the centers of the sampling points are arranged with regular vertical intervals.

In this improved addition, the vertical resolution is reduced half. Further, regarding to the horizontal addition, the resolution of G will be less than half. The resolutions of R and B will be also less than half.

SUMMARY OF THE INVENTION

It is an object of the present invention to provide a solid state imaging device that can execute signal addition with minimum decrease in horizontal and vertical resolution by adding pixel signals while original resolution is not sacrificed.

According to one aspect of the present invention, there is provided a solid state imaging device comprising: a semiconductor substrate defining a two-dimensional surface; a plurality of photoelectric conversion elements disposed in a light receiving area of said semiconductor substrate in a plurality of rows and columns; color filters in a plurality of colors, each color filter being arranged in correspondence with each photoelectric conversion element, wherein at least a color defining resolution corresponds to two photoelectric conversion elements adjacent to each other in a horizontal direction or in a vertical direction; a vertical electric charge transferring device that vertically transfers signal electric charges generated by the photoelectric conversion elements; a horizontal electric charge transfer device that horizontally transfers the signal electric charges transferred by the vertical electric charge transferring device; and an output device that outputs the signal electric charges transferred by the horizontal electric charge transferring device.

According to the present invention, there is provided a solid state imaging device that can execute signal addition with minimum decrease in horizontal and vertical resolution by adding pixel signals while original resolution is not sacrificed.

BRIEF DESCRIPTION OF THE DRAWINGS

FIG. 9 is a schematic plan view of a conventional solid state imaging device 800.

FIG. 10A to FIG. 10D are diagrams showing signal arrangements read by the conventional ITCCD solid state imaging device 800.

FIG. 12A to FIG. 12D are diagrams showing signal arrangements read by the conventional PIACCD solid state imaging device 200.

DETAILED DESCRIPTION OF THE PREFERRED EMBODIMENTS

Figure 1:
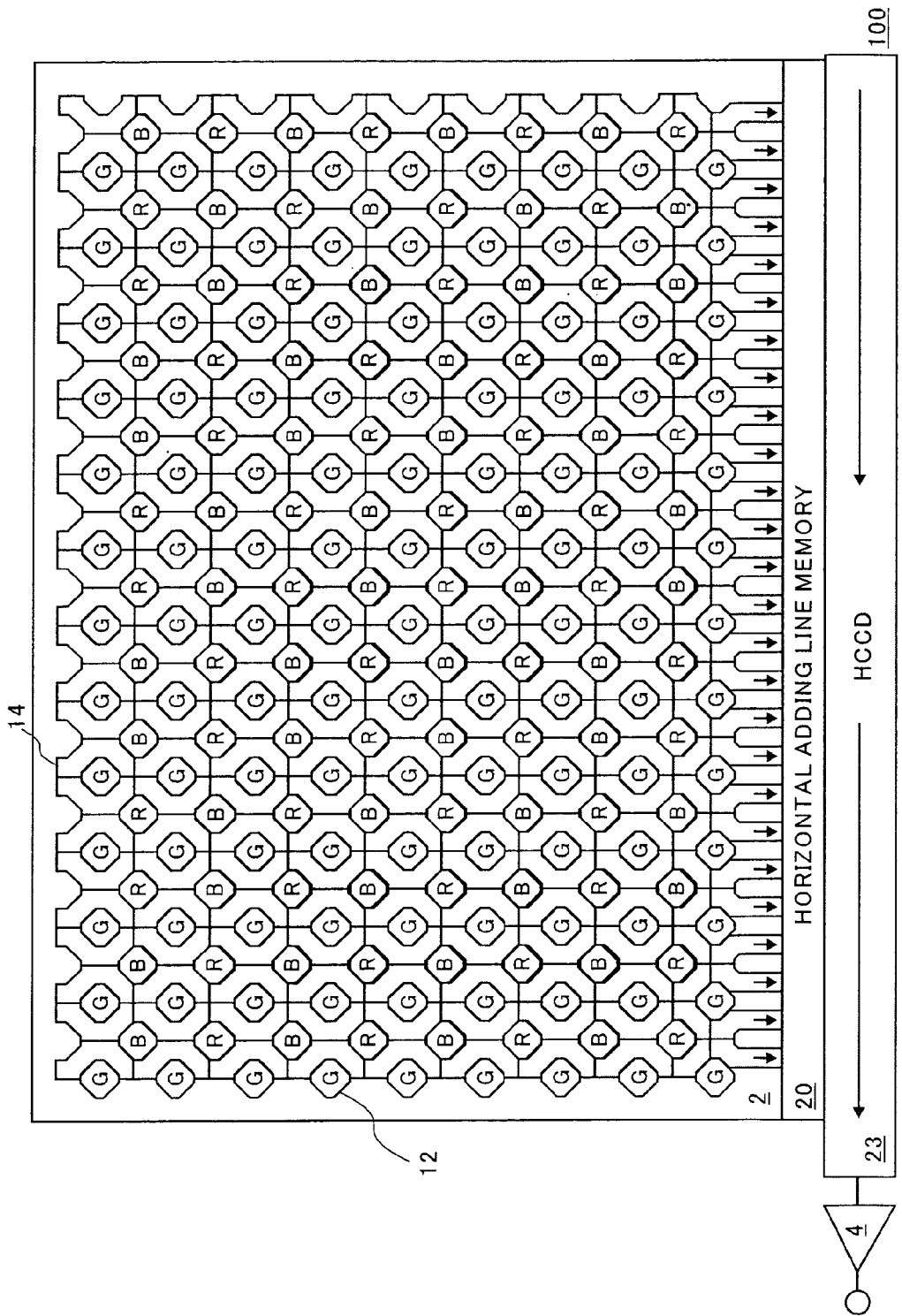
FIG. 1 is a schematic plan view of a solid state imaging device 100 according to a first embodiment of the present invention.

FIG. 1 is a schematic plan view of a solid state imaging device 100 according to a first embodiment of the present invention.

A solid state imaging device 100 at least includes a receiving region 2 having a large number of photoelectric conversion elements 12 and a vertical electric charge transfer device (vertical charge coupled device: VCCD) 14 that vertically transfers signal charge generated by the photoelectric conversion elements 12, a horizontal adding line memory 20, a horizontal addition circuit 23 including an eight-phase driven horizontal electric charge transfer device (horizontal charge coupled device: HCCD) that horizontally transfers the signal charge transferred by the VCCD) 14 and an output amplifier 4. Further, the contents of "DETAILED DESCRIPTION OF THE PREFERRED EMBODIMENTS" in the specification of Japanese Patent Application No. 2000-295896 (Japanese Laid-Open Patent NO. 2002-112119) are herein incorporated by reference for structural details of the horizontal adding line memory 20 and the horizontal addition circuit 23.

In every embodiment of the present invention, horizontal addition is carried out by using horizontal adding device consisted of the horizontal adding line memory 20 and the horizontal addition circuit 23.

The light-receiving region 2 is consisted of the plurality of the photoelectric conversion elements 12 by configuring them in the so-called pixel interleaved arrangement or the honeycomb arrangement. The pixel interleaved arrangement used in this specification indicates an arrangement combining the first lattice of a two-dimensional tetragonal matrix and the second lattice of the two-dimensional matrix of which each lattice point is positioned at the center of the first lattice. For example, the photoelectric conversion elements 12 in the even numbered rows (lines) or columns and in the odd numbered rows (lines) or columns are shifted in the horizontal direction by about a half pitch of the photoelectric conversion elements 12, and the photoelectric conversion elements 12 in the even numbered lines (rows or columns) and in the odd numbered lines (rows or columns) are shifted in the vertical direction by about a half pitch of photoelectric conversion elements 12. Each row of the photoelectric conversion elements 12 includes the photoelectric conversion elements 12 in either one of the even numbered row and in the odd numbered row. Similarly, Each line of the photoelectric conversion elements 12 includes the photoelectric conversion elements 12 in either one of the even numbered line and in the odd numbered line. The pixel interleaved arrangement is one of the arrangement styles for arranging a multiplicity of the photoelectric conversion elements in a matrix having a plurality of rows and lines.

The phrase "about a half" represents a pitch including an exact half pitch and also a pitch regarded as substantially equal to the half pitch from the performance and image quality although this pitch is different from the exact half pitch because of manufacture tolerances, rounding errors of pixel positions caused from design or manufacturing of a mask or the like.

The vertical electric charge transferring device 14 that reads out the signal electric charges generated by the photoelectric conversion elements 12 and vertically transfers them are formed between columns of the photoelectric conversion elements 12 by vertically traversing between spaces of the photoelectric conversion elements 12. Transfer channels are positioned in the zigzag spaces formed by the pixel interleaved arrangement, and the adjacent transfer channels apart from each other via the photoelectric conversion elements 12 and come closer to each other via the channel stop region.

The vertical electric charge transfer device 14 is consisted of the vertical transfer channel and transfer electrodes which are formed over the vertical transfer channel via an insulating film and traversing between the photoelectric conversion elements 12 to the horizontal direction.

A color filter is formed above each photoelectric conversion element 12. In the drawing, G, B and R respectively indicate the color filter of green, blue and red.

Figure 11:
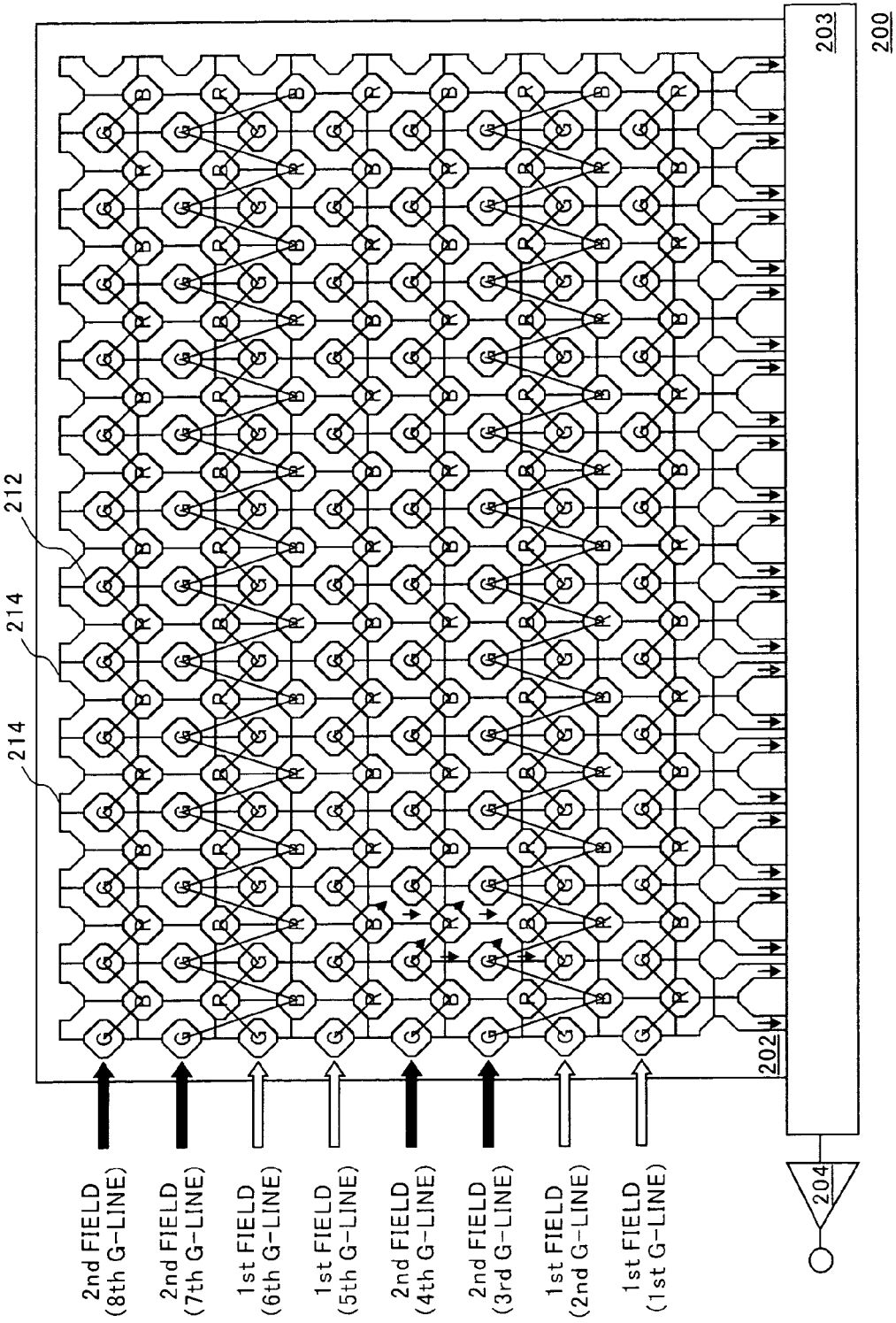
FIG. 11 is a schematic plan view of a conventional solid state imaging device 200.

In a first and second embodiments of the present invention, the color filters are arranged differently from the color filter arrangement of the solid-state imaging device 200 in FIG. 11 but a unit of two R pixels adjacent to each other in the horizontal direction and a unit of two B pixels adjacent to each other in the horizontal direction are arranged alternatively in the horizontal and the vertical directions. Moreover, in a third embodiment of the present invention, a group of an R line and a B line binding a G line therebetween is arranged in a stripe in the horizontal direction (refer to FIG. 4A). Further, in a fourth embodiment of the present invention, the same color filter arrangement as in the solid-state imaging device 200 in FIG. 11 is adopted as shown in FIG. 5.

Figure 2A:
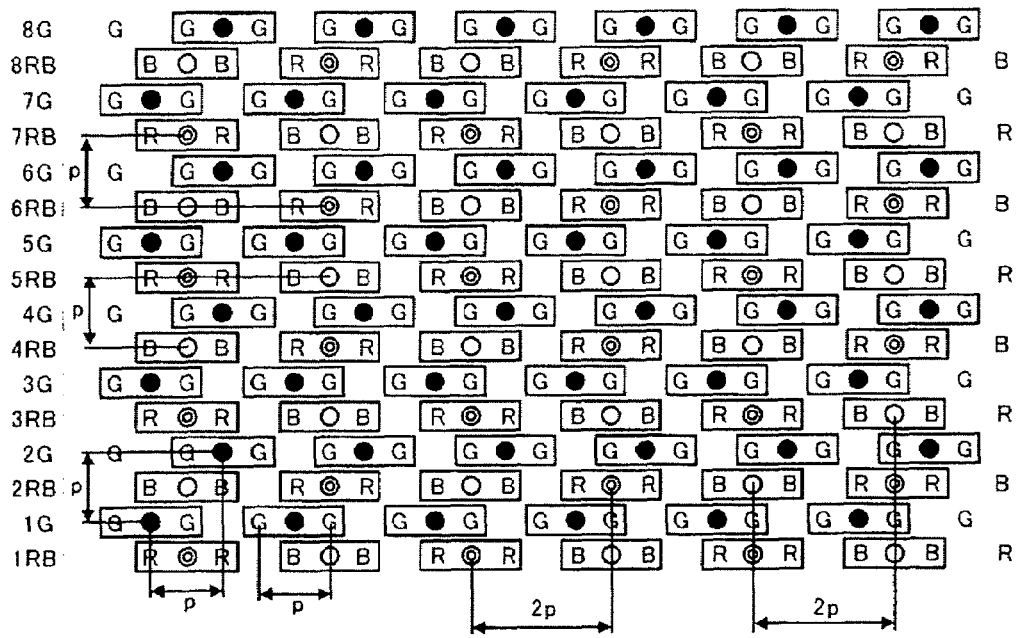
FIG. 2A to FIG. 2C are diagrams for explaining horizontal pixel addition according to the first embodiment of the present invention.
Figure 2B:
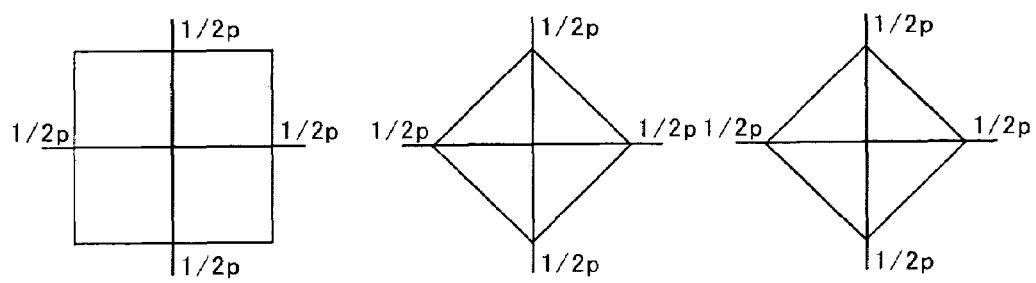
Figure 2C:
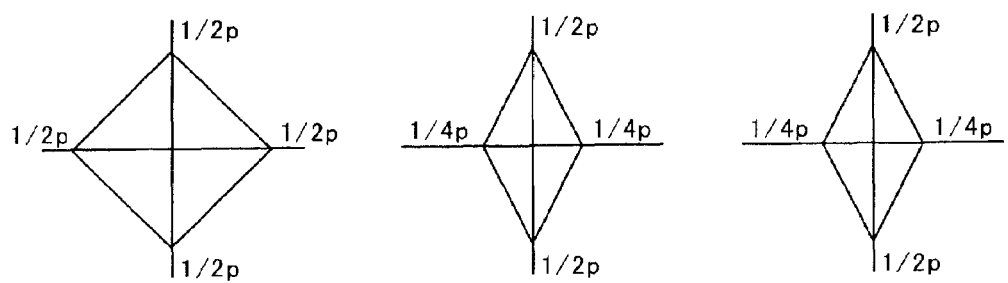

FIG. 2A to FIG. 2C are diagrams for explaining horizontal pixel addition according to the first embodiment of the present invention. FIG. 2A is a schematic plan view of the light receiving region 2 showing combinations of the pixels in the horizontal addition according to the first embodiment of the present invention. FIG. 2B shows graphs for Nyquist's limits of colors without the horizontal addition, and FIG. 2C shows graphs for Nyquist's limits of colors with the horizontal addition.

The Green (G) pixels are arranged in a tetragonal matrix with an arrangement pitch p in the horizontal and the vertical directions; therefore, two-dimensional Nyquist's limits by outputting signals individually without addition are ½p in the horizontal and the vertical directions as shown in FIG. 2B, and the Nyquist's limits in the horizontal and the vertical directions are same. The two-dimensional Nyquist's limit of each of the colors R, G and B is the reciprocal of twice a pitch (the arrangement pitch) p between adjacent pixels in the same color. Although a phase in the vertical direction is different from that in the horizontal direction, line pitches (vertical pitches) of the blue (B) pixels and the red (R) pixels are the arrangement pitch p as same as the horizontal pitches. Therefore, two-dimensional Nyquist's limits by outputting signals individually without addition are ½p in the horizontal and the vertical directions as shown in FIG. 2B, and the Nyquist's limits in the horizontal and the vertical directions are same. As described above, the color filter arrangement according to the first embodiment can obtain the same resolution as in the conventional color filter arrangement shown in FIG. 11 when the horizontal addition is not carried out.

Next, it will be explained that two pixels horizontally adjacent each other and enclosed in a rectangle in FIG. 2A are horizontally added. In the drawing, a black circle represents an added center of gravity of the G pixels, and a white circle represents an added center of gravity of the R pixels or B pixels.

In the first embodiment, phases of the added centers of gravity of the G pixels in an odd-numbered line and an even-numbered line are shifted by 180 degree; therefore, the horizontal pixel pitch (sampling pitch) of G after the addition will be p, and the Nyquist's limit in the horizontal direction will be ½p as similar to that without the addition. Since the addition is not carried out in the vertical direction, the two-dimensional Nyquist's limits are ½p in both of the horizontal and the vertical directions as shown in FIG. 2C, and the Nyquist's limits in the horizontal and the vertical directions are same. Regarding to R and B, the horizontal pixel pitch (sampling pitch) after the addition will be 2p, and the two-dimensional Nyquist's limits will be ¼p in the horizontal direction and ½p in the vertical direction. That is, resolutions of R and B will be a half by the horizontal addition according to the first embodiment.

As described in the above, according to the first embodiment, although the resolutions of R and B become a half by the horizontal addition, the resolution of G, which substantially defines resolution of an output image, remains the similar resolution as in the resolution without the addition. Moreover, quantities of signals are doubled by the two-pixel addition; therefore, an effective sensitivity will be doubled.

Figure 3A:
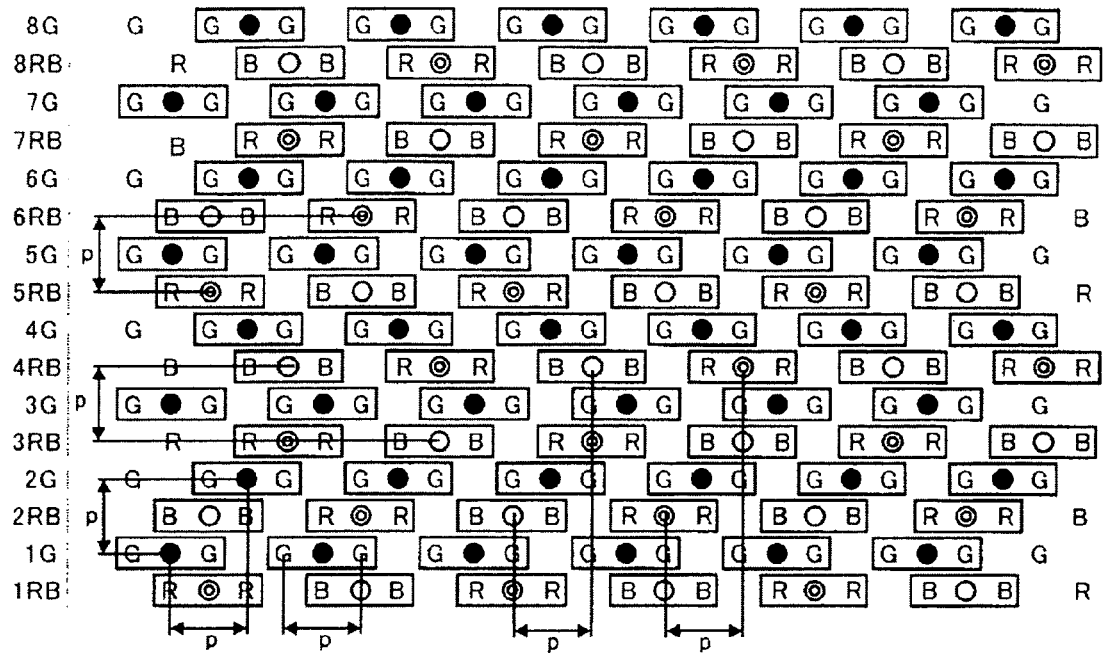
FIG. 3A to FIG. 3C are diagrams for explaining horizontal pixel addition according to a second embodiment of the present invention.
Figure 3B:
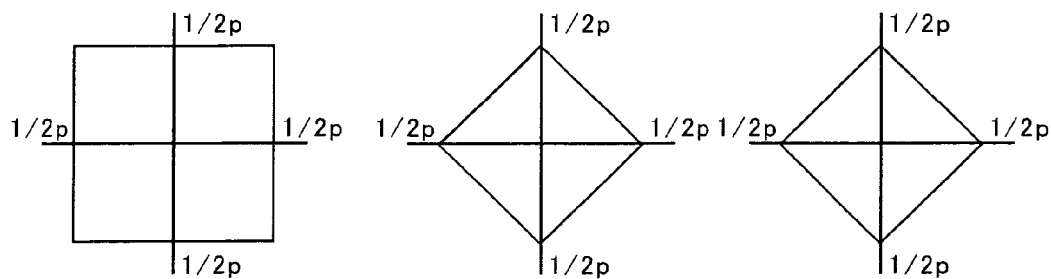
Figure 3C:
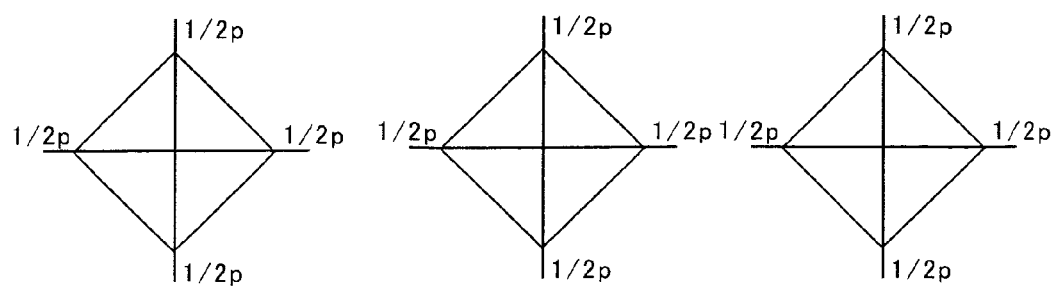

FIG. 3A to FIG. 3C are diagrams for explaining horizontal pixel addition according to a second embodiment of the present invention. FIG. 3A is a schematic plan view of the light receiving region 2 showing combinations of the pixels in the horizontal addition according to the second embodiment of the present invention. FIG. 3B shows graphs for Nyquist's limits of colors without the horizontal addition, and FIG. 3C shows graphs for Nyquist's limits of colors with the horizontal addition according to the second embodiment.

In this second embodiment, the color filters are arranged in the same arrangement as in the first embodiment; therefore, the two-dimensional Nyquist's limits are similar to those in the first embodiment.

Next, it will be explained that two pixels horizontally adjacent each other and enclosed in a rectangle in FIG. 3A are horizontally added. In the drawing, a black circle represents an added center of gravity of the G pixels, and a white circle represents an added center of gravity of the R pixels or B pixels.

A difference between the first embodiment and the second embodiment is that spatial phases of the pixel arrangements of R and B at the time of the horizontal addition in a group of the first and the second R/B lines and a group of the third and the fourth R/B lines are shifted by 180 degrees. Since the phases are shifted by the pitch p, the horizontal pixel pitches (sampling pitches) of R and B after the addition will be p, and the two-dimensional Nyquist's limits in the horizontal and the vertical directions will be ½p as shown in FIG. 3C, which are the similar to those without the addition. Therefore, by the horizontal addition according to the second embodiment, the resolutions of all the colors R, G and B remain similar to those without the addition.

As described in the above, according to the second embodiment, the resolutions of R, G and B remain the similar resolution as in the resolution without the addition. Moreover, quantities of signals are doubled by the two-pixel addition; therefore, an effective sensitivity will be doubled.

Figure 4A:
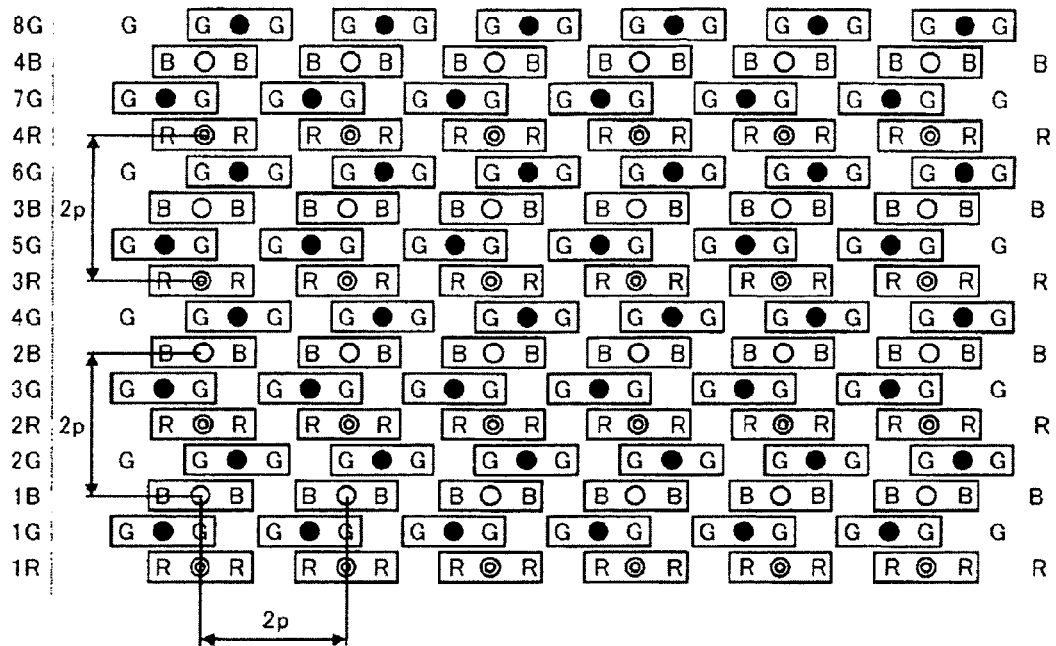
FIG. 4A to FIG. 4C are diagrams for explaining a first example of horizontal pixel addition according to a third embodiment of the present invention.
Figure 4B:
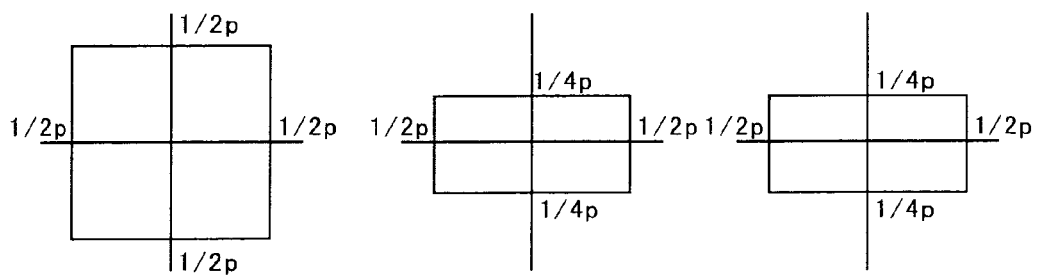
Figure 4C:
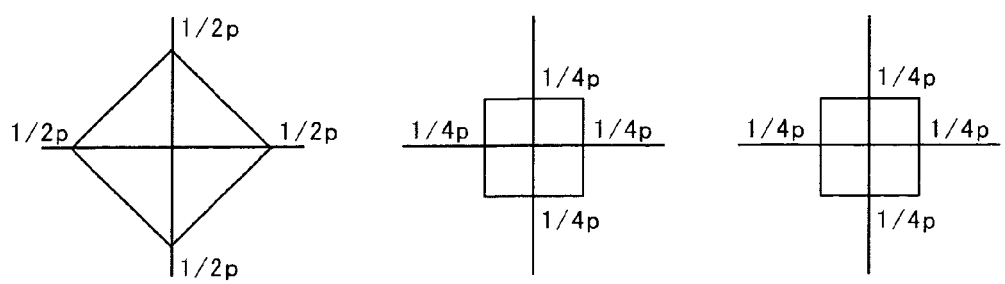

FIG. 4A to FIG. 4C are diagrams for explaining a first example of horizontal pixel addition according to a third embodiment of the present invention. FIG. 4A is a schematic plan view of the light receiving region 2 showing combinations of the pixels in the first example of the horizontal addition according to the third embodiment of the present invention. FIG. 3B shows graphs for Nyquist's limits of colors without the horizontal addition, and FIG. 3C shows graphs for Nyquist's limits of colors with the horizontal addition according to the first example of the third embodiment.

In the third embodiment of the present invention, a group of an R line and a B line binding a G line therebetween is arranged in a stripe in the horizontal direction. In this case, the two-dimensional Nyquist's limits without the addition are ½p in the horizontal direction and ¼p in the vertical direction that is the horizontal resolution is twice the vertical resolution. Regarding to this point, the conventional PIACCD solid state imaging device is superior to a balance of the horizontal and the vertical resolutions; however, it is very difficult to recognize the inferiority of the image by the third embodiment in the sizes of the paper such as the L-size, 4×6 or the post card when the solid state imaging device has ten millions pixels. Moreover, the difference is difficult to be recognized even in a A4 sized paper except a special imaging target.

Next, it will be explained that two pixels horizontally adjacent each other and enclosed in a rectangle in FIG. 4A are horizontally added. In the drawing, a black circle represents an added center of gravity of the G pixels, and a white circle represents an added center of gravity of the R pixels or B pixels.

In the third embodiment as similar to the first and the second embodiment, phases of the added centers of gravity of the G pixels in an odd-numbered line and an even-numbered line are shifted by 180 degree; therefore, the horizontal pixel pitch (sampling pitch) of G after the addition will be p, and the Nyquist's limit in the horizontal direction will be ½p as similar to that without the addition.

Regarding to R and B, the horizontal pixel pitch (sampling pitch) after the addition will be 2p by adding adjacent two pixels because it is the same situation as reducing the number of the pixels in the horizontal direction a half. Therefore, the two-dimensional Nyquist's limits will be ¼p in both of the horizontal and the vertical directions as shown in FIG. 4C, and the horizontal resolution and the vertical resolution become similar to each other. These Nyquist's limits are similar to those obtained by so-called Bayer arrangement.

That is, by the first example of the horizontal addition according to the third embodiment, the similar resolutions as in the solid state imaging apparatus having the Bayer arranged half number of the pixels in the PIACCD solid state imaging apparatus.

Figure 5A:
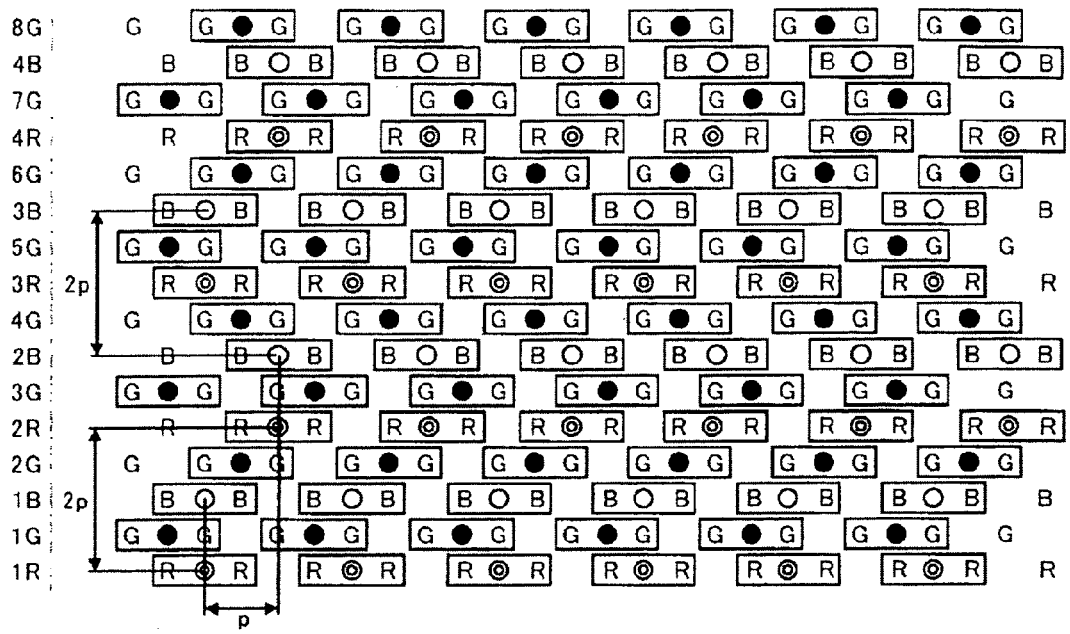
FIG. 5A to FIG. 5C are diagrams for explaining a second example of horizontal pixel addition according to the third embodiment of the present invention.
Figure 5B:
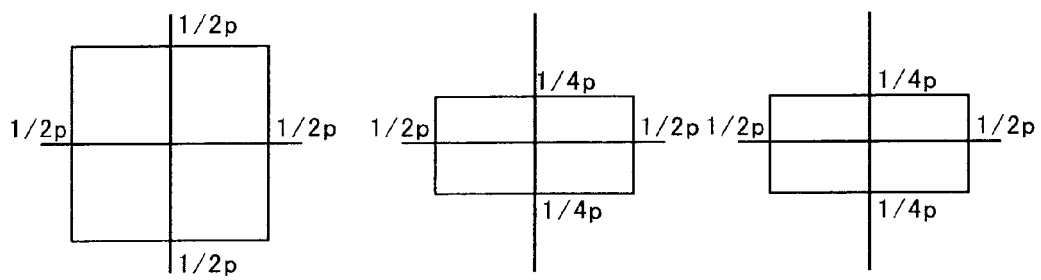
Figure 5C:
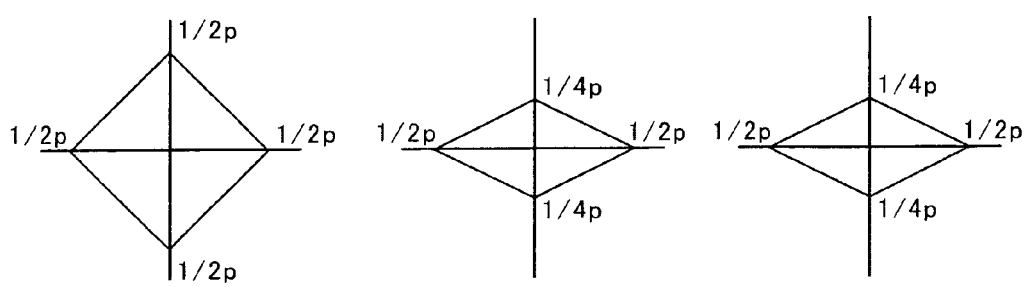

FIG. 5A to FIG. 5C are diagrams for explaining a second example of horizontal pixel addition according to the third embodiment of the present invention. FIG. 5A is a schematic plan view of the light receiving region 2 showing combinations of the pixels in the second example of the horizontal addition according to the third embodiment of the present invention. FIG. 3B shows graphs for Nyquist's limits of colors without the horizontal addition, and FIG. 3C shows graphs for Nyquist's limits of colors with the horizontal addition according to the second example of the third embodiment.

In this second example, the color filters are arranged in the same arrangement as in the first example shown in FIG. 4A;

therefore, the two-dimensional Nyquist's limits are similar to those in the first example shown in FIG. 4B.

In this second example of the third embodiment, it is different from the first example that the spatial phases of each of horizontal adding combinations of R and B is shifted by 180 degrees. That is, the spatial phases of the sampling centers of the first R line and the second R line are shifted by 180 degrees. Moreover, the spatial phases of the sampling centers of the first B line and the second B line are shifted by 180 degrees. By horizontally adding under the combinations, the horizontal pixel pitches (sampling pitches) of R and B after the addition will be p, and the two-dimensional Nyquist's limits in the horizontal direction will be ½p. Therefore, decrease in the resolution by the horizontal addition can be restrained comparing to the first example of the third embodiment.

Moreover, quantities of signals are doubled by the two-pixel addition; therefore, an effective sensitivity will be doubled according to both of the first and second example of the third embodiment of the present invention.

Figure 6:
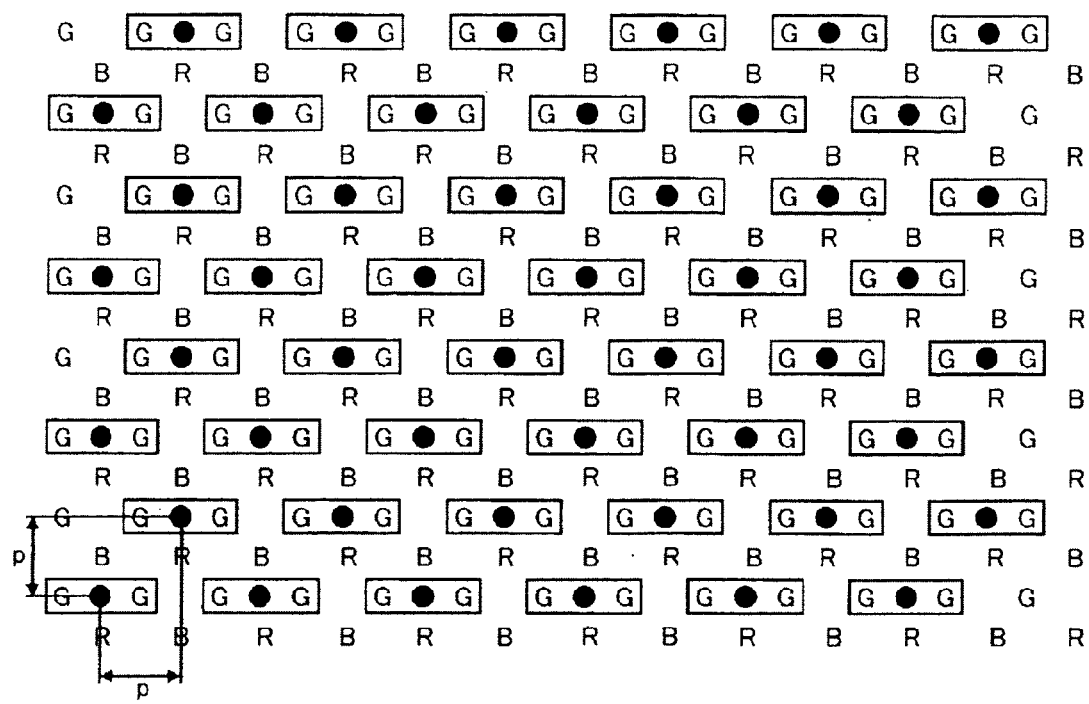
FIG. 6 is a plan view showing the light reviving region 2 for explaining horizontal pixel addition according to a fourth embodiment of the present invention.

FIG. 6 is a plan view showing the light reviving region 2 for explaining horizontal pixel addition according to a fourth embodiment of the present invention.

In the fourth embodiment, the color filters are arranged similarly to the conventional solid state imaging apparatus shown in FIG. 11, the spatial phases of the added centers of gravity of the G pixels, which substantially defines resolution of an output image, in an odd-numbered line and an even-numbered line are shifted by 180 degree as shown in FIG. 6. By adopting this type of combination, decrease in the resolution after the horizontal addition can be restrained even if the color filter arrangement of the conventional technique is adopted.

Figure 7A:
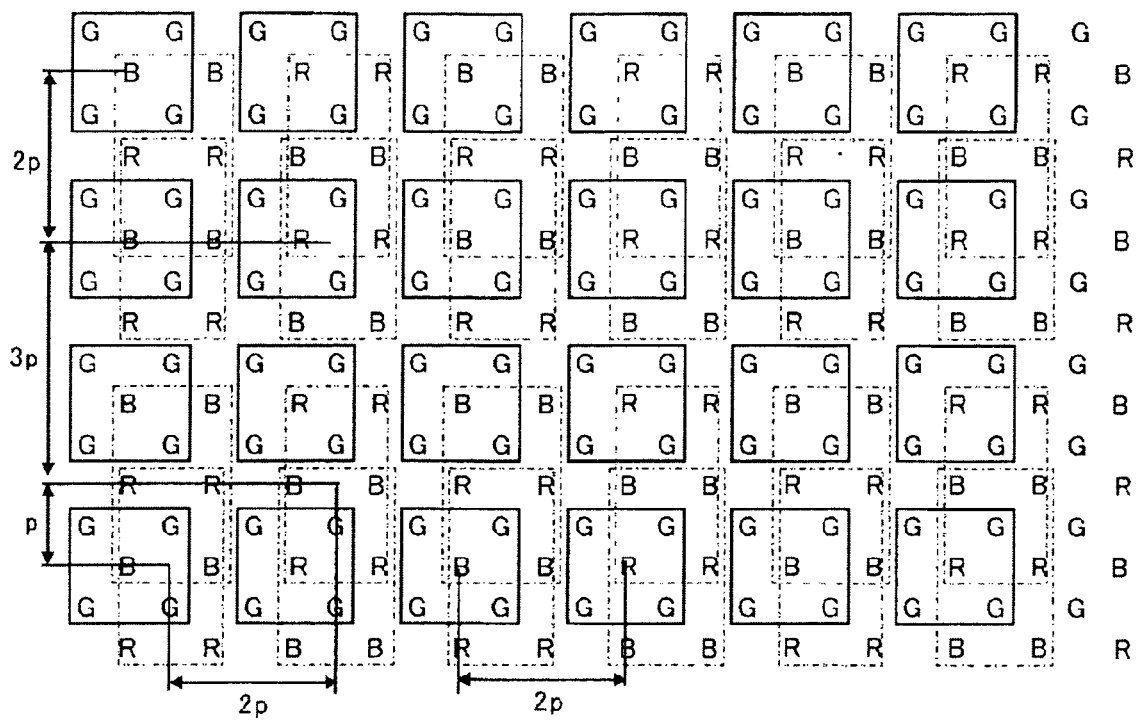
FIG. 7A and FIG. 7B are diagrams for explaining 4-pixel addition according to a first modified example of the first embodiment of the present invention.
Figure 7B:
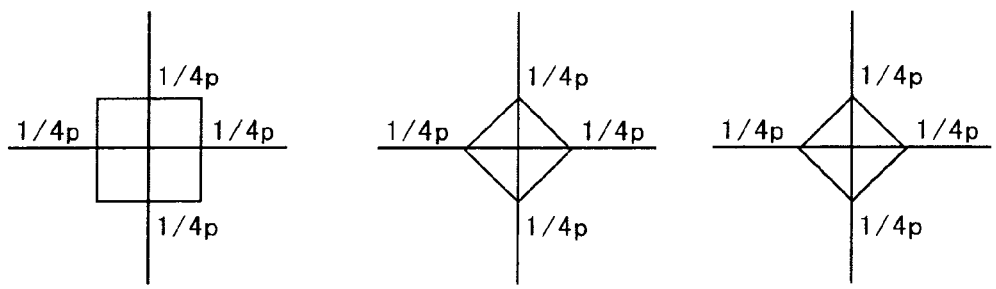

FIG. 7A and FIG. 7B are diagrams for explaining 4-pixel addition according to a first modified example of the first embodiment of the present invention. FIG. 7A is a schematic plan view of the light receiving region 2 showing combinations of the pixels in the horizontal addition according to the first modified example of the first embodiment of the present invention. FIG. 7B shows graphs for Nyquist's limits of colors with the 4-pixel addition according to the first modified example of the first embodiment.

In this modified example, the spatial phases of the added centers of gravity of the G pixels are agreed with each other horizontal lines. Therefore, the horizontal pixel pitch (sampling pitch) of G after the horizontal addition will be 2p, and the Nyquist's limit in the horizontal direction will be ¼p. In addition to that, the vertical pixel pitch (sampling pitch) of G after the vertical addition will also be 2p, and the Nyquist's limit in the vertical direction will be ¼p. Therefore, the two-dimensional Nyquist's limits will be ¼p in both of the horizontal and the vertical directions as shown in FIG. 7B, and the horizontal resolution and the vertical resolution become similar to each other.

Regarding to R and B, the horizontal pixel pitch (sampling pitch) after the additions will be 2p in the horizontal direction and p and 3p alternatively in the vertical direction, which can be considered as about 2p by the average in terms of macro view. Therefore, the two-dimensional Nyquist's limits as shown in FIG. 7B can be obtained approximately. By this 4-pixel addition, the resolutions of R, G and B will be a half of those without the additions. Moreover, quantities of signals are multiplied by four by the four-pixel addition; therefore, an effective sensitivity will be four times that without the additions.

Figure 8A:
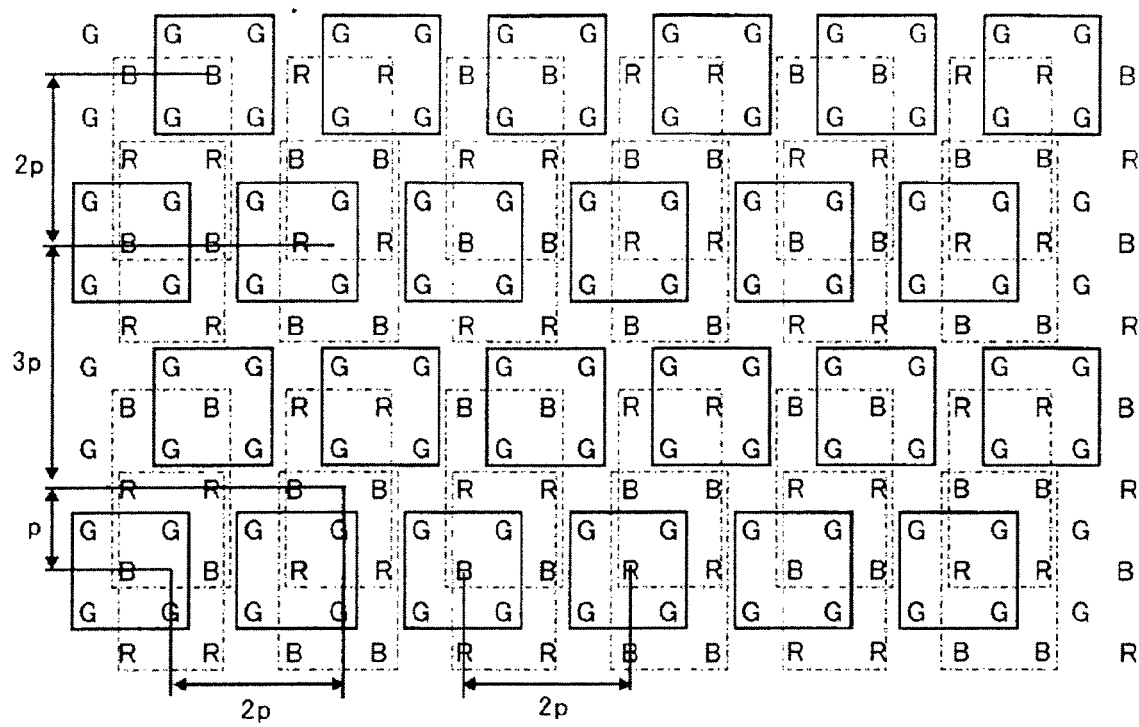
FIG. 8A and FIG. 8B are diagrams for explaining 4-pixel addition according to a second modified example of the first embodiment of the present invention.
Figure 8B:
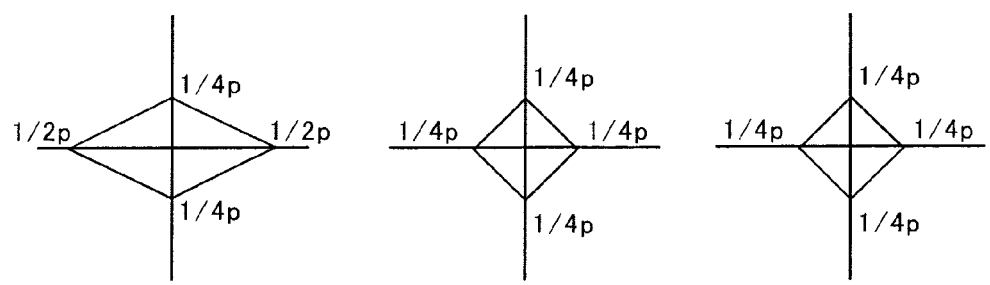

FIG. 8A and FIG. 8B are diagrams for explaining horizontal pixel addition according to a second modified example of the first embodiment of the present invention. FIG. 8A is a schematic plan view of the light receiving region 2 showing combinations of the pixels in the horizontal addition according to the second modified example of the first embodiment of the present invention. FIG. 8B shows graphs for Nyquist's limits of colors with the horizontal addition according to the second modified example of the first embodiment embodiment.

In this second modified example, unlikely to the first modified example, phases of the added centers of gravity of the G pixels in an odd-numbered line and an even-numbered line are shifted by 180 degree; therefore, the horizontal pixel pitch (sampling pitch) of G after the addition will be p, and the Nyquist's limit in the horizontal direction will be ½p as similar to that without the addition. Other combinations are the same as in the first modified example. By doing that, an effective sensitivity can be four times that without the additions, and the resolution of G, which substantially defines resolution of an output image, remains the similar resolution as in the resolution without the additions.

As described in the above, according to the embodiments of the present invention, the horizontal two-pixel addition is carried out between two pixels adjacent to each other in the horizontal direction, and the addition of the pixels that substantially defines resolution of an output image (e.g., G pixels) are added by shifting the spatial phases of adjacent horizontal lines by 180 degrees. Therefore, decrease in the resolutions is restrained in the minimum degree and the image signal having the doubled sensitivity can be obtained.

Furthermore, signals of all the pixels can be output independently without the adding operations when higher resolution is needed whereas an image with improved sensitivity by adding pixels may be needed during normal shooting and when shooting in dark place.

Furthermore, signals of all the pixels can be output independently without the adding operations when higher resolution is needed whereas an image with improved sensitivity by adding pixels at the normal shooting and a shooting in a dark place.

Moreover, an image having much higher sensitivity can be output by increasing number of adding times.

Moreover, the embodiments have been explained by using the CCD-type solid state imaging device as examples, it is not limited to the CCD-type solid state imaging device. For example, a CMOS-type solid state imaging device can be adapted for the present invention.

The present invention has been described in connection with the preferred embodiments. The invention is not limited only to the above embodiments. It is apparent that various modifications, improvements, combinations, and the like can be made by those skilled in the art.

What are claimed are:

1. A solid state imaging device comprising:
   a semiconductor substrate defining a two-dimensional surface;
   a plurality of photoelectric conversion elements disposed in a light receiving area of said semiconductor substrate in a plurality of rows and columns;
   color filters in a plurality of colors, each color filter being arranged in correspondence with each photoelectric conversion element, such that said plurality of photoelectric conversion elements comprise:
   first and second rows of photoelectric conversion elements having a green color filter; and
   a third row of photoelectric conversion elements having at least one of red and blue color filters and formed between said first and second rows;

a vertical electric charge transfer device that vertically transfers signal electric charges generated by the photoelectric conversion elements;

a horizontal electric charge transfer device that horizontally transfers the signal electric charges transferred by the vertical electric charge transfer device; and an output device that outputs the signal electric charges transferred by the horizontal electric charge transfer device, wherein signal electric charges from at least two of said photoelectric conversion elements in said first, second and third rows which are adjacent in a horizontal direction are added, and wherein centers of gravity of said photoelectric conversion elements having added signal electric charges in said first row have a spatial phase that is shifted from a spatial phase of said photoelectric conversion elements having added signal electric charges in said second row and centers of gravity of said photoelectric conversion elements having added signal electric charges in said third row have a spatial phase that is shifted from a spatial phase of said photoelectric conversion elements having added signal electric charges in said first and second rows.

2. The solid state imaging device according to claim 1, wherein each of said plurality of colors corresponds to two photoelectric conversion elements adjacent to each other in a horizontal direction.

3. The solid state imaging device according to claim 1, wherein the color filters in green are arranged in a tetragonal matrix or on lattice points of a rectangle, and wherein a unit of two color filters in red adjacent to each other in the horizontal direction and a unit of two color filters in blue adjacent to each other in the horizontal direction are arranged alternatively in the horizontal and the vertical directions and spatial phases of the color filters in red and blue are shifted by 180 degrees toward a spatial phase of the color filters in green.

4. The solid state imaging device according to claim 1, wherein the color filters in green are arranged in a tetragonal matrix or on lattice points of a rectangle, and wherein a line of the color filters in red and a line of the color filters in blue are arranged alternatively between a line of the color filters in green in the horizontal direction and spatial phases of the color filters in red and blue are shifted by 180 degrees toward a spatial phase of the color filters in green.

5. The solid state imaging device according to claim 1, further comprising:

a horizontal adding device that functions by cooperating with the horizontal electric charge transfer device for adding signal electric charges of at least two photoelectric conversion elements adjacent in the horizontal direction.

6. The solid state imaging device according to claim 5, wherein the horizontal adding device adds electric charges of the photoelectric conversion elements adjacent to each other in the horizontal direction and corresponding to a color defining resolution with shifting spatial phases of centers of gravity of added signals by 180 degrees in every horizontal line of the photoelectric conversion elements.

7. The solid state imaging device according to claim 5, wherein the vertical electric charge transfer device further functions as a vertically adding device for adding signal electric charges of at least two photoelectric conversion elements adjacent in the vertical direction.

8. The solid state imaging device according to claim 7, wherein electric charges of four of the photoelectric conversion elements adjacent to each other in the horizontal direction and the vertical direction and corresponding to same color are added.

9. The solid state imaging device according to claim 7, wherein electric charges of four of the photoelectric conversion elements adjacent to each other in the horizontal direction and the vertical direction and corresponding to same color are added, and wherein electric charges of the photoelectric conversion elements adjacent to each other in the horizontal and the vertical directions and corresponding to the color defining resolution are added with shifting spatial phases of centers of gravity of added signals by 180 degrees in every horizontal line of the photoelectric conversion elements.

10. The solid state imaging device according to claim 1, wherein electric charges of at least two of the photoelectric conversion elements are added when shooting a normal scene or a dark scene, and wherein electric charges of all of the photoelectric conversion elements are output individually by said output device for high resolution.

11. The solid state imaging device according to claim 1, wherein said color filters include a unit of two red color filters adjacent to each other and a unit of two blue color filters adjacent to each other arranged alternatively in said third row in said plurality of rows of photoelectric conversion elements.

12. The solid state imaging device according to claim 11, wherein said third row of photoelectric conversion elements is formed between said first and second rows of photoelectric conversion elements in a vertical direction.

13. The solid state imaging device according to claim 1, further comprising:

a horizontal adding device for adding signal electric charges of at least two photoelectric conversion elements adjacent in the horizontal direction.

14. The solid state imaging device according to claim 13, wherein said horizontal adding device comprises:

a horizontal adding line memory; and a horizontal addition circuit which includes said horizontal electric charge transfer device.

15. The solid state imaging device according to claim 1, wherein said vertical electric charge transfer device is formed between columns of said photoelectric conversion elements by vertically traversing between spaces of the photoelectric conversion elements.

16. A solid state imaging device comprising:

plural photoelectric conversion elements configured to include a pixel interleaved arrangement in a light receiving area of a semiconductor substrate;

plural color filters formed on said plural photoelectric conversion elements, such that said plural photoelectric conversion elements comprise:

first and second rows of photoelectric conversion elements having a green color filter; and a third row of photoelectric conversion elements having at least one of red and blue color filters and formed between said first and second rows; and a horizontal adding device for adding signal electric charges of at least two photoelectric conversion elements, wherein signal electric charges from at least two of said photoelectric conversion elements in said first, second and third rows which are adjacent in a horizontal direction are added, and wherein centers of gravity of said photoelectric conversion elements having added signal electric charges in said first row have a spatial phase that is shifted from a spatial phase of said photoelectric conversion elements having added signal electric charges in said second row and centers of gravity of said photoelectric conversion elements having added signal electric charges in said third row have a spatial phase that is shifted from a spatial phase of said photoelectric conversion elements having added signal electric charges in said first and second rows.

17. The solid state imaging device according to claim 16, wherein said pixel interleaved arrangement includes a first lattice of a two-dimensional tetragonal matrix, and a second lattice of a two-dimensional matrix having lattice points positioned at the center of the first lattice.

18. A solid state imaging device comprising:
   a light receiving area comprising:
      plural photoelectric conversion elements having a pixel interleaved arrangement; and
      plural color filters formed on said plural photoelectric conversion elements, such that said plural photoelectric conversion elements include first and second rows of photoelectric conversion elements having a green color filter, and a third row of photoelectric conversion elements having at least one of red and blue color filters and formed between said first and second rows; and
   a horizontal adding device for adding signal electric charges from at least two of said photoelectric conversion elements in said first, second and third rows which are adjacent in a horizontal direction,
   wherein centers of gravity of said photoelectric conversion elements having added signal electric charges in said first row have a spatial phase that is shifted from a spatial phase of said photoelectric conversion elements having added signal electric charges in said second row and centers of gravity of said photoelectric conversion elements having added signal electric charges in said third row have a spatial phase that is shifted from a spatial phase of said photoelectric conversion elements having added signal electric charges in said first and second rows.

* * * * *